United States Patent
Ahn et al.

(10) Patent No.: US 10,679,684 B2
(45) Date of Patent: Jun. 9, 2020

(54) DATA OUTPUT BUFFER HAVING PULL-UP MAIN DRIVER AND MEMORY DEVICE HAVING THE DATA OUTPUT BUFFER

(71) Applicant: SK hynix Inc., Gyeonggi-do (KR)

(72) Inventors: Keun Seon Ahn, Seoul (KR); Yo Han Jeong, Gyeonggi-do (KR); Jin Ha Hwang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/253,827

(22) Filed: Jan. 22, 2019

(65) Prior Publication Data

US 2019/0371381 A1 Dec. 5, 2019

(30) Foreign Application Priority Data

May 29, 2018 (KR) .......................... 10-2018-0061373

(51) Int. Cl.
*G11C 8/08* (2006.01)
*G11C 11/408* (2006.01)
*G11C 7/10* (2006.01)
*G11C 8/06* (2006.01)
*G11C 29/02* (2006.01)

(52) U.S. Cl.
CPC .............. *G11C 8/08* (2013.01); *G11C 7/1051* (2013.01); *G11C 8/06* (2013.01); *G11C 11/4085* (2013.01); *G11C 29/022* (2013.01); *G11C 29/028* (2013.01)

(58) Field of Classification Search
CPC ........... G11C 8/08; G11C 8/06; G11C 7/1051; G11C 11/4085
See application file for complete search history.

(56) References Cited

U.S. PATENT DOCUMENTS

| | | | | |
|---|---|---|---|---|
| 5,220,208 A * | 6/1993 | Schenck | .............. | H03K 17/163 326/27 |
| 7,514,954 B2 * | 4/2009 | Kim | ...................... | G11C 7/1051 326/30 |
| 7,940,078 B2 * | 5/2011 | Pan | ..................... | H03K 19/0005 326/30 |
| 9,467,145 B2 * | 10/2016 | Song | ................ | H03K 19/01758 |
| 10,269,395 B2 * | 4/2019 | Arai | ...................... | G11C 7/1057 |

FOREIGN PATENT DOCUMENTS

| KR | 100332455 | 4/2002 |
|---|---|---|
| KR | 1020120064482 | 6/2012 |
| KR | 10-2019-0029011 | 3/2019 |

* cited by examiner

*Primary Examiner* — Gene N Auduong
(74) *Attorney, Agent, or Firm* — IP & T Group LLP

(57) ABSTRACT

The present disclosure relates to a data out buffer and a memory device having the same. The data out buffer includes a pull-up main driver, coupled between a power supply terminal and an output terminal, configured to output data of a high level; and a pull-down main driver, coupled between the output terminal and a ground terminal, configured to output data of a low level, wherein the pull-up main driver comprises a main pull-up transistor of a first type; and a plurality of first trim transistors, each of a second type.

28 Claims, 8 Drawing Sheets

DATA OUTPUT BUFFER HAVING PULL-UP MAIN DRIVER AND MEMORY DEVICE HAVING THE DATA OUTPUT BUFFER

CROSS-REFERENCE TO RELATED APPLICATION

The present application claims priority under 35 U.S.C. § 119(a) to Korean patent application number 10-2018-0061373, filed on May 29, 2018, which is incorporated herein by reference in its entirety.

BACKGROUND

Field of Invention

Various embodiments of the invention relate to a data output buffer and a memory device having the same.

Particularly, the embodiments relate to a data output buffer including pull-up and pull-down main drivers.

Description of Related Art

A memory device may store data and output the stored data. The memory device may be a volatile memory device that loses stored data when power supply is blocked or disconnected, or a non-volatile memory device that retains stored data even when power supply is blocked or disconnected. The memory device may include a memory cell array storing data, peripheral circuits performing various operations including program, read and erase operations, and a control logic controlling the peripheral circuits.

A memory controller may control data communication between a host and the memory device.

The memory device may communicate with the memory controller through a channel. For example, a data output buffer, among the peripheral circuits included in the memory device, may output data read from the memory device through a channel.

SUMMARY

Various embodiments are directed to a data output buffer capable of reducing capacitance and a memory device including the same.

According to an embodiment, a data output buffer may include a pull-up main driver, coupled between a power supply terminal and an output terminal, configured to output data of a high level; and a pull-down main driver, coupled between the output terminal and a ground terminal, configured to output data of a low level, wherein the pull-up main driver comprises: a main pull-up transistor of a first type; and a plurality of first trim transistors, each of a second type.

According to an embodiment, a memory device may include a memory cell array configured to store data; a peripheral circuit configured to perform a program operation, a read operation, an erase operation, or an output operation on the memory cell array; and control logic configured to control the peripheral circuit in response to a command received from a memory controller, wherein the peripheral circuit comprises: a pull-up main driver including transistors of first and second types and configured to output data of a high level to the memory controller according to control of the control logic during the output operation; and a pull-down main driver including the transistors of the second type and configured to output data of a low level to the memory controller according to control of the control logic during the output operation.

According to an embodiment, a data output buffer may include a pull-up driver configured to pull up data; and a pull-down driver configured to pull down the data, wherein the pull-up driver includes: a PMOS transistor configured to pull up the data; and one or more NMOS transistors configured to emphasize or de-emphasize the pull-up of the data in response to pull-up trim codes respectively corresponding thereto, and wherein the pull-down driver includes: a main transistor configured to pull down the data; and one or more trim transistors configured to emphasize or de-emphasize the pull-down of the data in response to pull-down trim codes respectively corresponding thereto.

DETAILED DESCRIPTION

Various embodiments will now be described more fully with reference to the accompanying drawings. However, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. Throughout the specification, reference to "an embodiment," "another embodiment," or the like is not necessarily to only one embodiment, and different references to any such phrase are not necessarily to the same embodiment(s).

It will be understood that when an element is referred to as being "coupled" or "connected" to a certain element, it may be directly coupled or connected to the certain element, or may be indirectly coupled or connected to the certain element with one or more intervening elements therebetween. Whether two elements are directly or indirectly connected or coupled, communication between the elements may be wired or wireless, unless specifically stated or the context indicates otherwise. In the specification, when an element is referred to as "comprising" or "including" a component, such open ended phrase does not exclude the presence or addition of one or more other components, unless specifically stated or the context indicates otherwise.

Figure 1:
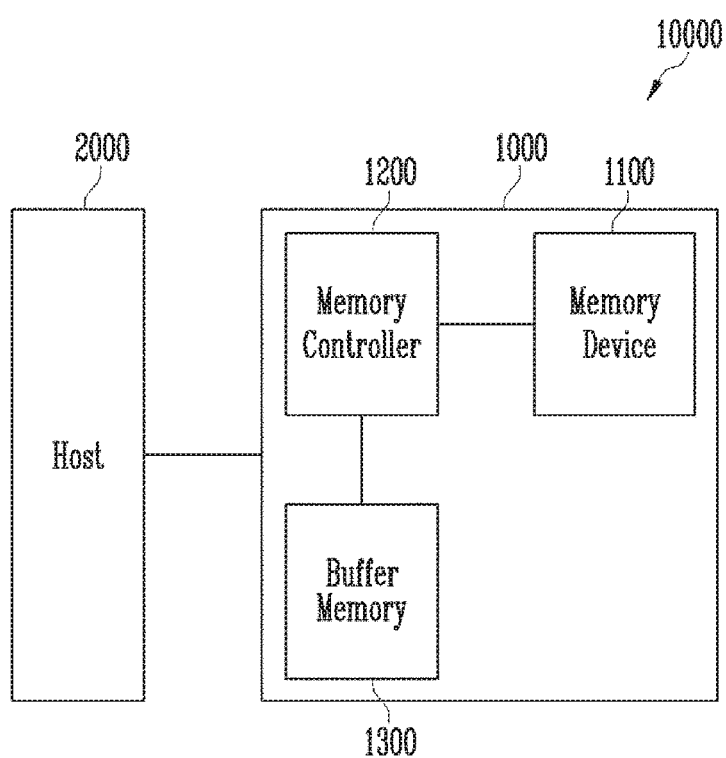
FIG. 1 is a diagram illustrating a memory system according to an embodiment of the present disclosure.

FIG. 1 is a diagram illustrating a memory system 1000.

Referring to FIG. 1, an electronic system 10000 may include the memory system 1000 and a host 2000 controlling the memory system 1000.

The memory system 1000 may include a memory device 1100 storing data, a buffer memory 1300 temporarily storing data for operations of the memory system 1000, and a memory controller 1200 controlling the memory device 1100 and the buffer memory 1300 in response to control of the host 2000.

The host 2000 may communicate with the memory system 1000 using at least one of various communication methods such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Non-volatile Memory express (NVMe), Universal Flash Storage (UFS), Secure Digital (SD), MultiMedia Card (MMC), embedded MMC (eMMC), Dual Inline Memory Module (DIMM), Registered DIMM (RDIMM), and Load Reduced DIMM (LRDIMM).

The memory device 1100 may include a volatile memory device that loses stored data when power supply is blocked or interrupted, or a non-volatile memory device that retains stored data even when power supply is blocked or interrupted. The memory controller 1200 may control the memory device 1100 to perform a program, read, or erase operation. For example, during a program operation, the memory device 1100 may receive a command, an address, and data from the memory controller 1200 and perform a program operation. During a read operation, the memory device 1100 may receive a command and an address from the memory controller 1200 and output read data to the memory controller 1200. The memory device 1100 may include an input/output circuit for inputting and outputting data.

The memory controller 1200 may control the general operations of the memory system 1000 and control data exchange between the host 2000 and the memory device 1100. For example, the memory controller 1200 may control the memory device 1100 to program, read or erase data in response to a request from the host 2000. In addition, the memory controller 1200 may receive data and a logical address from the host 2000 and convert the logical address into a physical address indicating a region where the data is stored. In addition, the memory controller 1200 may store a logical-to-physical address mapping table configuring a mapping relationship between a logical address and a physical address in the buffer memory 1300.

The buffer memory 1300 may serve as an operation memory or a cache memory of the memory controller 1200, and may store system data used in the memory system 1000 in addition to the above information. According to an embodiment, the buffer memory 1300 may include Double Data Rate Synchronous Dynamic Random Access Memory (DDR SDRAM), Low Power Double Data 4 (LPDDR4) SDRAM, Graphics Double Data Rate (GDDR) SDRAM, Low Power DDR (LPDDR), or Rambus Dynamic Random Access Memory (RDRAM).

Figure 2:
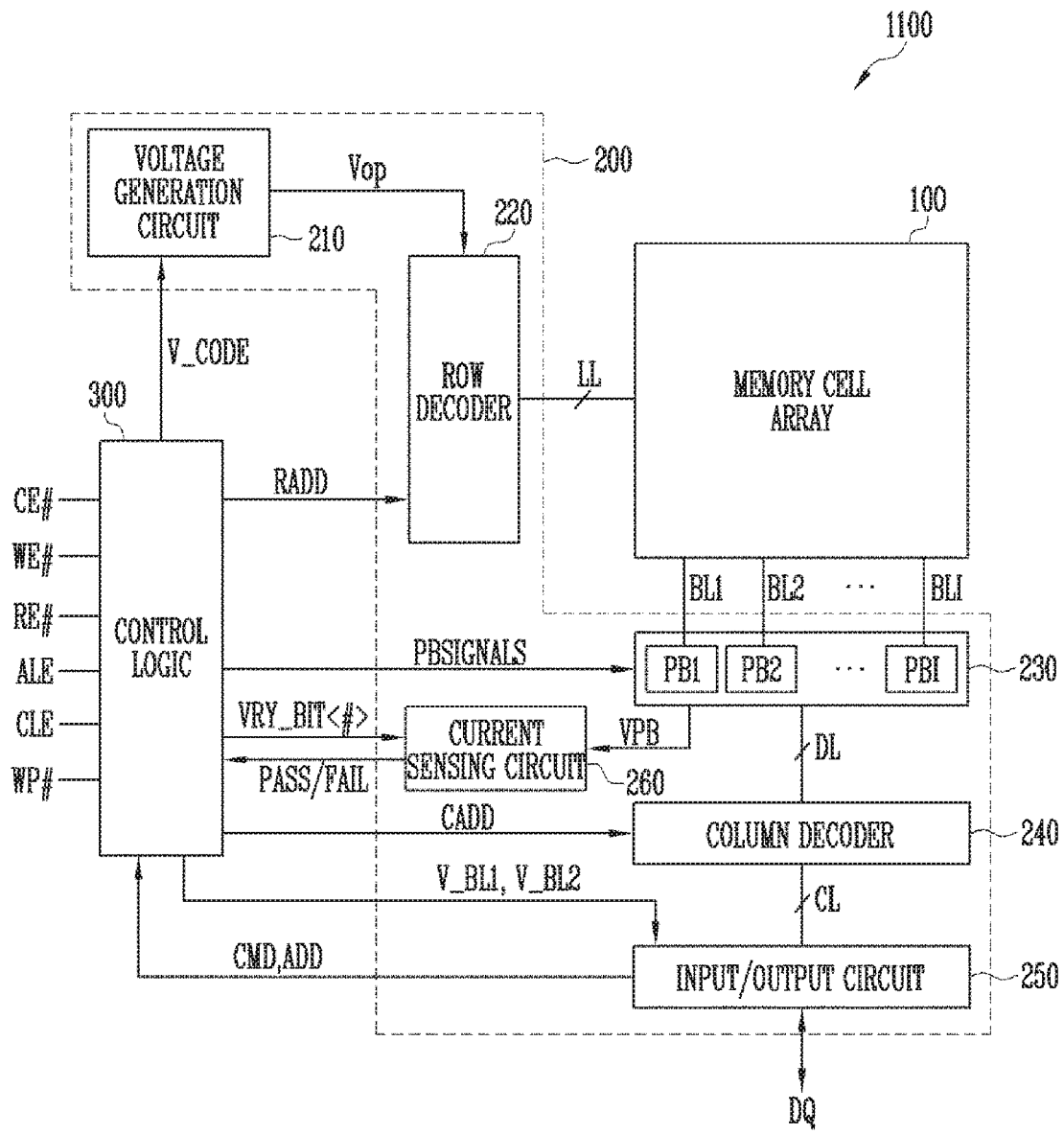
FIG. 2 is a diagram illustrating a memory device such as that shown in FIG. 1.

FIG. 2 is a diagram illustrating a memory device, for example, the memory device 1100 shown in FIG. 1.

Referring to FIG. 2, the memory device 1100 may be a volatile memory device or a non-volatile memory device. Although FIG. 2 shows a non-volatile memory device as an embodiment, the present invention is not limited thereto.

The memory device 1100 may include a memory cell array 100 which stores data therein. The memory device 1100 may include peripheral circuits 200 configured to perform a program operation to store data in the memory cell array 100, a read operation to read the stored data, an erase operation to erase the stored data, or an output operation to output the read data. The memory device 1100 may include control logic 300 configured to control the peripheral circuits 200 in response to control of the memory controller 1200 shown in FIG. 1.

The memory cell array 100 may include a plurality of memory blocks. The memory blocks may store user data and various types of information for performing the operations of the memory device 1100. The memory blocks may have a two-dimensional or three-dimensional structure. The latter structure provides higher integration density. A two-dimensional memory block may have memory cells arranged in parallel with a substrate, and a three-dimensional memory block may have memory cells stacked in a vertical direction to the substrate.

The control logic 300 may control the peripheral circuits 200 to perform program, read and erase operations. For example, the peripheral circuits 200 may include a voltage generation circuit 210, a row decoder 220, a page buffer group 230, a column decoder 240, an input/output circuit 250, and a current sensing circuit 260.

The voltage generating circuit 210 may generate various operating voltages Vop used to perform program, read and erase operations in response to an operation code V_CODE. Examples of the operating voltages Vop generated by the voltage generating circuit 210 in response to the control logic 300 may include a program voltage, a verify voltage, a pass voltage, a read voltage, and an erase voltage.

The row decoder 220 may transfer the operating voltages Vop to local lines LL coupled to a selected memory block, among the memory blocks of the memory cell array, in response to a row address RADD. The local lines LL may include local word lines, local drain select lines, and local source select lines. In addition, the local lines LL may include various lines coupled to a memory block, such as a source line.

The page buffer group 230 may be coupled to bit lines BL1 to BLI coupled to the memory blocks of the memory cell array 100. The page buffer group 230 may include a plurality of page buffers PB1 to PBI coupled to the bit lines BL1 to BLI, respectively. The page buffers PB1 to PBI may operate in response to page buffer control signals PBSIGNALS. For example, the page buffers PB1 to PBI may temporarily store data received through the bit lines BL1 to BLI, or may sense a voltage or current in the bit lines BL1 to BLI, respectively, during a read or verify operation.

The column decoder 240 may transfer data between the input/output circuit 250 and the page buffer group 230 in response to a column address CADD. For example, the column decoder 240 may exchange data with the page buffers PB1 to PBI through data lines DL, or exchange data with the input/output circuit 250 through column lines CL.

The input/output circuit 250 may receive a command CMD, an address ADD, and data from the memory controller 1200 shown in FIG. 1 through an input/output pad DQ, and output the read data to the memory controller 1200 through an input/output pad DQ. For example, the input/output circuit 250 may transfer the command CMD and the address ADD from the memory controller 1200 shown in FIG. 1 to the control logic 300, or may exchange data DATA with the column decoder 240. In addition, when data is not output, first and second blocking signals V_BL1 and V_BL2 may be activated or enabled, and the input/output circuit 250 may block current or voltage leakage in response to the first and second blocking signals V_BL1 and V_BL2. The first and second blocking signals V_BL1 and V_BL2 may be output by the control logic 300 depending on the configuration of the input/output circuit 250. For example, when the input/output circuit 250 includes low-voltage transistors, the first and second blocking signals V_BL1 and V_BL2 may be used.

The current sensing circuit 260 may generate a reference current in response to an allowable bit VRY_BIT<#> and compare a sensing voltage VPB received from the page buffer group 230 with a reference voltage generated by the reference current to output a pass signal PASS or a fail signal FAIL during a read operation or a verify operation.

The control logic 300 may receive the command CMD and the address ADD in response to signals received through pads CE #, WE #, RE #, ALE, CLE and WP #. The control logic 300 may control the peripheral circuits 200 by outputting the operation code V_CODE, the row address RADD, the page buffer control signals PBSIGNALS, and the allowable bit VRY_BIT<#> in response to the command CMD and the address ADD. The control logic 300 may determine whether a verify operation passes or fails in response to the pass or fail signal PASS or FAIL. In addition, the control logic 300 may output the first and second blocking signals V_BL1 and V_BL2 in response to a received command. For example, the control logic 300 may activate or enable the first and second blocking signals V_BL1 and V_BL2 when a data output command is received, and may deactivate or disable the first and second blocking signals V_BL1 and V_BL2 when a command associated with an internal operation of the memory device 1100 is received without outputting data.

Figure 3:
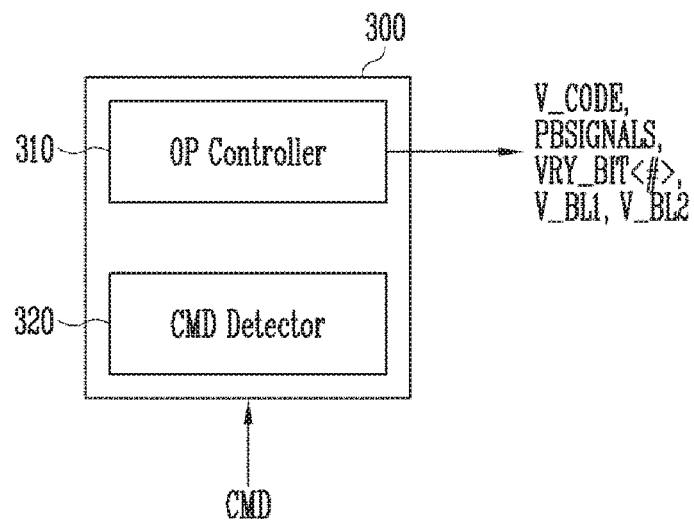
FIG. 3 is a diagram illustrating a control logic such as that shown in FIG. 2.

FIG. 3 is a diagram illustrating a control logic, for example, the control logic 300 shown in FIG. 2.

Referring to FIG. 3, the control logic 300 may include an operation (OP) controller 310 and a command (CMD) detector 320.

The CMD detector 320 may determine a type of the command CMD received from the memory controller 1200 of FIG. 1 and transfer information about a detection result along with the command CMD to the OP controller 310. For example, the command CMD from the memory controller 1200 may include a command for an internal operation of the memory device 1100 of FIG. 1 (internal operation command) and a command for outputting result data of the internal operation (output command). For example, the internal operation command may include a program command, a read command, and an erase command, and the output command may be a command to output result data of a read operation performed in response to a read command.

When the OP controller 310 detects that the command received from the CMD detector 320 is an internal operation command, the OP controller 310 may output operation signals (V_CODE, PBSIGNALS, and VRY_BIT<#>) to execute the received command. When the internal operation is performed, the OP controller 310 may deactivate or disable the first and second blocking signals V_BL1 and V_BL2. When the command received from the CMD detector 320 is detected as an output command, the OP controller 310 may output signals for an output operation, among the operation signals (V_CODE, PBSIGNALS, and VRY_BIT<#>) and keep the first and second blocking signals V_BL1 and V_BL2 active or enabled when the data is output.

The CMD detector 320 may be removed depending on transistors constituting the input/output circuit 250. For example, when the input/output circuit 250 includes low-voltage transistors, the CMD detector 320 may be included in the control logic 300. However, when the input/output circuit 250 includes normal transistors, the CMD detector 320 may be removed. The low-voltage transistors may be turned on by a lower voltage than the normal transistors.

When the control logic 300 does not include the CMD detector 320, the command CMD received from the host 2000 may be directly input to the OP controller 310 and the OP controller 310 may output the operation signals (V_CODE, PBSIGNALS, and VRY_BIT<#>) in response to the input command. The CMD detector 320 may not output the first and second blocking signals V_BL1 and V_BL2.

Figure 4:
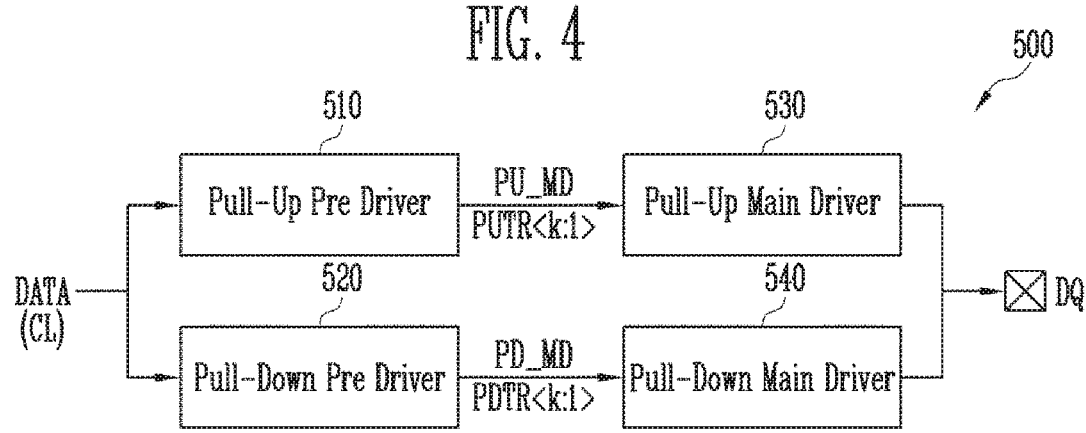
FIG. 4 is a diagram illustrating a data output buffer according to an embodiment of the present disclosure.

FIG. 4 is a diagram illustrating a data output buffer 500 according to an embodiment.

Referring to FIG. 4, the input/output circuit 250 shown in FIG. 2 may include the data output buffer 500 for outputting data.

The data output buffer 500 may amplify the data DATA received through the column lines CL of FIG. 2 and output the amplified data DATA through the input/output pad DQ. The data output buffer 500 may include a pull-up pre-driver 510, a pull-down pre-driver 520, a pull-up main driver 530, and a pull-down main driver 540.

The pull-up pre-driver 510 may output pull-up main data PU_MD and pull-up trim codes PUTR<k:1> according to the received data DATA. Inverted data of the received data DATA may be output as the pull-up main data PU_MD, while a swing width of the received data DATA is maintained. For example, the pull-up pre-driver 510 may output low level pull-up main data PU_MD when the received data DATA is high level, and may output high level pull-up main data PU_MD when the received data DATA is low level. The phrases low level and high level refer to the subject data of a low or high level respectively.

The pull-up trim codes PUTR<k:1> may include codes for correcting the pull-up main data PU_MD according to the received data DATA. For example, when the swing width of the received data DATA is less than a reference width, codes for increasing the swing width may be output, and when the swing width of the received data DATA is greater than the reference width, codes for reducing the swing width may be output. The pull-up trim codes PUTR<k:1> may be output in inverted form. The pull-up trim codes PUTR<k:1> may be composed of either or both of '0' and '1' bits. Since a correction resolution increases as the number of bits included in the pull-up trim codes PUTR<k:1> increases, the pull-up main data PU_MD may be corrected more finely. However, since the number of transistors turned on or off according to the pull-up trim codes PUTR<k:1> is to increase as the number of bits in the pull-up trim codes PUTR<k:1> increases, the number of bits of the pull-up trim codes PUTR<k:1> may be set in consideration of the size of the data output buffer 500.

The pull-down pre-driver 520 may output pull-down main data PD_MD and the pull-down trim codes PDTR<k:1> according to the received data DATA. Inverted data of the received data DATA may be output as the pull-down main data PD_MD while, a swing width of the received data DATA is maintained. For example, the pull-down pre-driver 520 may output high level pull-down main data PD_MD when the received data DATA is low level, and may output low level pull-down main data PD_MD when the received data DATA is high level.

The pull-down trim codes PDTR<k:1> may include codes for correcting the pull-down main data PD_MD according to the received data DATA. For example, when the swing width of the received data DATA is less than a reference width, codes for increasing the swing width may be output, and when the swing width of the received data DATA is greater than the reference width, codes for reducing the swing width may be output. The pull-down trim codes PDTR<k:1> may be composed of either or both of '0' and '1' bits. The number of bits of the pull-down trim codes PDTR<k:1> may depend on the size of the data output buffer 500.

The pull-up main driver 530 may output high level data to the input/output pad DQ in response to the pull-up main data PU_MD and the pull-up trim codes PUTR<k:1>. For example, the pull-up main driver 530 may output high level data to the input/output pad DQ when receiving low level pull-up main data PU_MD. The pull-up main driver 530 may not output data when receiving high level pull-up main data PU_MD. When the pull-up main driver 530 does not output data, an output node of the pull-up main driver 530 may be floated.

The pull-down main driver 540 may output low level data to the input/output pad DQ in response to the pull-down main data PD_MD and the pull-down trim codes PDTR<k:1>. For example, the pull-down main driver 540 may output low level data to the input/output pad DQ when receiving the high level pull-down main data PD_MD. For example, the pull-down main driver 540 may not output data when receiving the low level pull-down main data PD_MD. When the pull-down main driver 540 does not output data, an output node of the pull-down main driver 540 may be floated.

Figure 5:
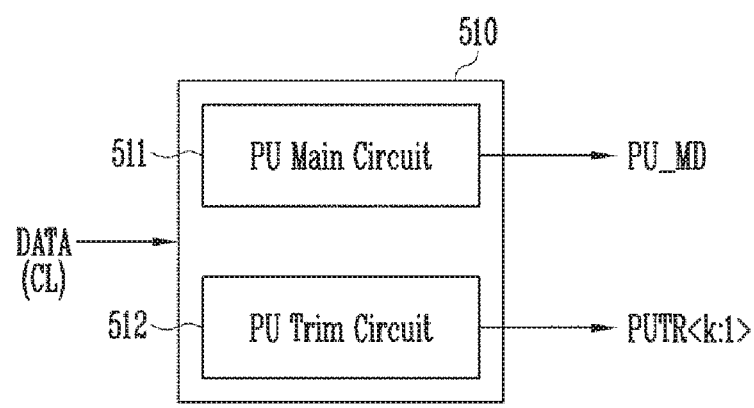
FIG. 5 is a diagram illustrating a pull-up pre-driver such as that shown in FIG. 4 according to an embodiment of the present disclosure.

FIG. 5 is a diagram illustrating the pull-up pre-driver 510 shown in FIG. 4.

Referring to FIG. 5, the pull-up pre-driver 510 may include a pull-up (PU) main circuit 511 and a pull-up (PU) trim circuit 512.

The PU main circuit 511 may invert the received data DATA and output the pull-up main data PU_MD. For example, the PU main circuit 511 may output low level pull-up main data PU_MD when receiving high level data DATA, and may output high level pull-up main data PU_MD when receiving low level data DATA. In addition, the PU main circuit 511 may maintain the swing width of the pull-up main data PU_MD to be the same as a swing width of the received data DATA by reflecting the swing width of the received data DATA.

The PU trim circuit 512 may output the pull-up trim codes PUTR<k:1> for correcting the pull-up main data PU_MD according to the received data DATA. For example, the pull-up trim circuit 512 may output the pull-up trim codes PUTR<k:1> to increase a swing width of the received data DATA when the swing width is less than a reference width, and may output the pull-up trim codes PUTR<k:1> to reduce the swing width of the received data DATA when the swing width is greater than the reference width. In addition, the pull-up trim circuit 512 may control the number of '0' and '1' bits included in the pull-up trim codes PUTR<k:1> according to a difference between the swing width of the received data DATA and the reference width. For example, the pull-up trim circuit 512 may output the pull-up trim codes PUTR<k:1> by combining the '0' and '1' bits according to the received data DATA.

Figure 6:
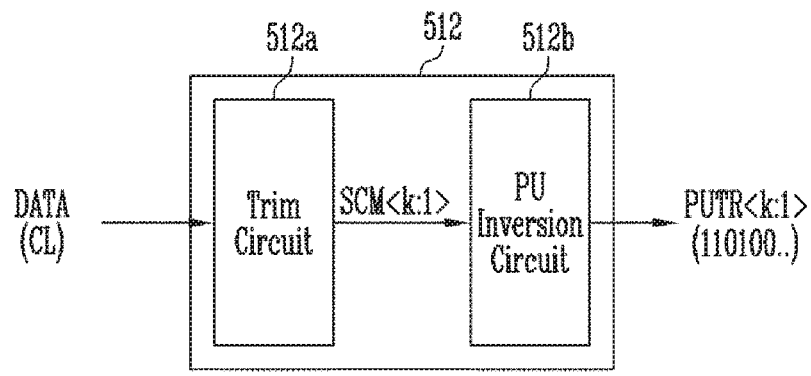
FIG. 6 is a diagram illustrating a pull-up trim circuit such as that shown in FIG. 5 according to an embodiment of the present disclosure.

FIG. 6 is a diagram illustrating a pull-up (PU) trim circuit, e.g., the pull-up (PU) trim circuit 512 shown in FIG. 5, according to an embodiment of the present disclosure.

Referring to FIG. 6, the pull-up trim circuit 512 may include a trim circuit 512a and a pull-up (PU) inversion circuit 512b.

The trim circuit 512a may receive the data DATA and output sub-codes SCM<k:1> for correcting the received data DATA. The sub-codes SCM<k:1> may include a plurality of bits.

The pull-up inversion circuit 512b may invert the sub-codes SCM<k:1> and output the inverted sub-codes as the pull-up trim codes PUTR<k:1>. For example, when the sub-codes SCM<k:1> having values '001011 . . . ' are output, the pull-up trim codes PUTR<k:1> may be output as '110100 . . . ' by inverting the values '001011 . . . ' of the sub-codes SCM<k:1>. Transistors operating in response to the pull-up trim codes PUTR<k:1>, among the transistors in the pull-up main driver 530 shown in FIG. 4, may be NMOS transistors, not PMOS transistors. In other words, when transistors operating in response to the pull-up trim codes PUTR<k:1> are PMOS transistors, the sub-codes SCM<k:1> may be directly transferred to the pull-up main driver 530. However, according to the present embodiment, since the transistors operating in response to the pull-up trim codes PUTR<k:1> are NMOS transistors, an inverted version of the sub-codes SCM<k:1> may be transferred to the pull-up main driver 530 as the pull-up trim codes PUTR<k:1>. When the pull-up main data PU_MD has a high level, data should not be output from the pull-up main driver 530, and thus the trim circuit 512a may output the sub-codes SCM<k:1> of all 1's and the pull-up trim codes PUTR<k:1> of all 0's may be output by the PU inversion circuit 512b.

Figure 7:
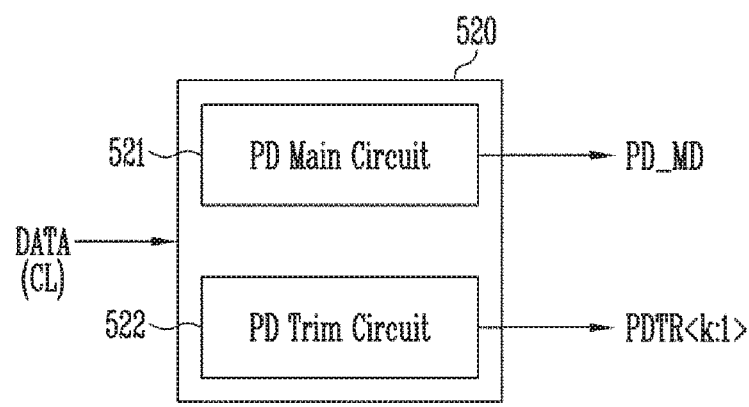
FIG. 7 is a diagram illustrating a pull-down pre-driver such as that shown in FIG. 4.

FIG. 7 is a diagram illustrating the pull-down pre-driver 520 shown in FIG. 4.

Referring to FIG. 7, the pull-down pre-driver 520 may include a pull-down (PD) main circuit 521 and a pull-down (PD) trim circuit 522.

The PD main circuit 521 may invert the received data DATA and output the pull-down main data PD_MD. For example, the PD main circuit 521 may output low level pull-down main data PD_MD when receiving high level data DATA, and may output high level pull-down main data PD_MD when receiving low level data DATA. In addition, the PD main circuit 521 may maintain a swing width of the pull-down main data PD_MD the same as a swing width of the received data DATA by directly reflecting the swing width of the received data DATA.

The pull-down trim circuit 522 may output the pull-down trim codes PDTR<k:1> for correcting the pull-down main data PD_MD according to the received data DATA. For example, the PD trim circuit 522 may output the pull-down trim codes PDTR<k:1> to increase the swing width of the received data DATA when the swing width is less than a reference width, and may output the pull-down trim codes PDTR<k:1> to reduce the swing width of the received data DATA when the swing width is greater than the reference width. In addition, the PD trim circuit 522 may control the number of '0' and '1' bits included in the pull-down trim codes PDTR<k:1> according to a difference between the swing width of the received data DATA and the reference width. For example, the PD trim circuit 522 may output the pull-down trim codes PDTR<k:1> by combining the '0' and '1' bits according to the received data DATA.

Figure 8:
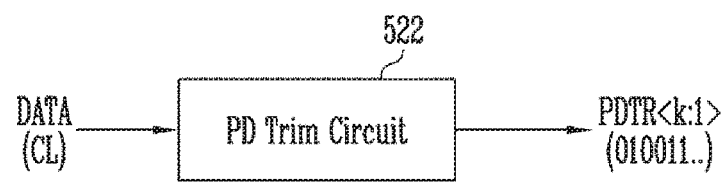
FIG. 8 is a diagram illustrating a pull-down trim circuit such as that shown in FIG. 7 according to an embodiment of the present disclosure.

FIG. 8 is a diagram illustrating an embodiment of the PD trim circuit 522 shown in FIG. 7.

Referring to FIG. 8, the pull-down trim circuit 522 may receive the data DATA and output the pull-down trim codes PDTR<k:1> for correcting the received data DATA. The pull-down trim codes PDTR<k:1> may include a plurality of bits. For example, when the pull-down trim codes PDTR<k:1> are output as '010011 . . . ', the codes '010011 . . . ' may be output to the pull-down main driver 540 shown in FIG. 4.

In other words, the pull-down trim circuit 522 may perform the same functions as the trim circuit 512a of FIG. 6. The pull-down trim circuit 522 may be configured to correct a minimum voltage level for generating data, and the trim circuit 512a may be configured to correct a maximum voltage level for generating data.

Figure 9:
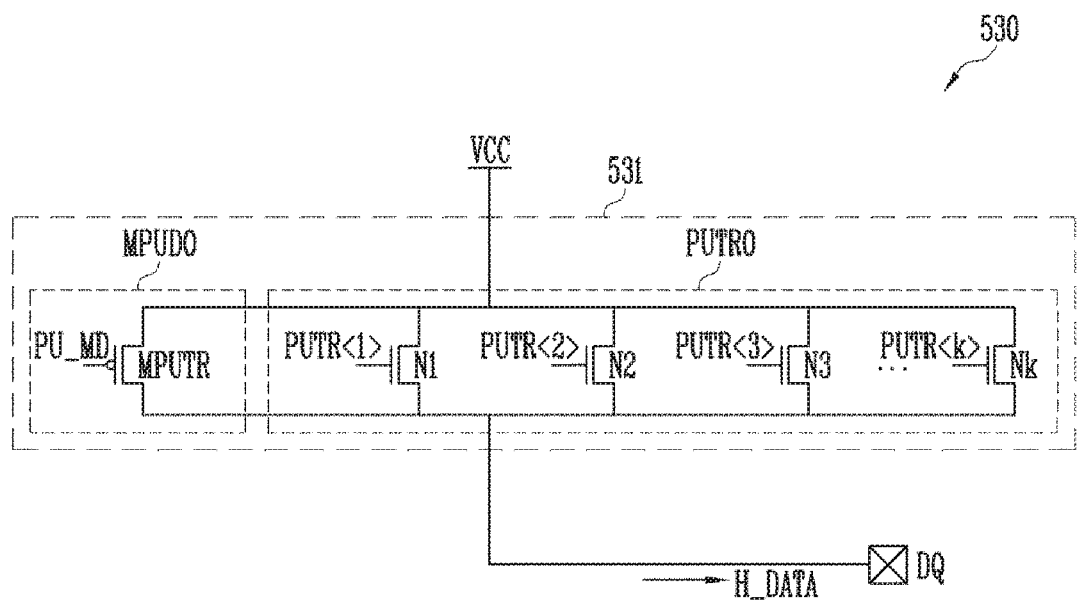
FIG. 9 is a diagram illustrating a pull-up main driver such as that shown in FIG. 4.

FIG. 9 is a diagram illustrating the pull-up main driver 530 shown in FIG. 4.

Referring to FIG. 9, the pull-up main driver 530 may include pull-up transistors 531. The pull-up transistors 531 may be coupled between a power supply VCC terminal and the input/output pad DQ.

The pull-up transistors 531 may include a main pull-up data output circuit MPUDO and a pull-up trim output circuit PUTRO.

The main pull-up data output circuit MPUDO may include a main pull-up transistor MPUTR which is turned on or off in response to the pull-up main data PU_MD. The main pull-up transistor MPUTR may be a first type of transistor, e.g., a PMOS transistor. Therefore, when low level pull-up main data PU_MD is received, the main pull-up transistor MPUTR may be turned on to couple the power supply VCC terminal and the input/output pad DQ, so that high level data DATA may be output. When high level pull-up main data PU_MD is received, the main pull-up transistor MPUTR may be turned off, so that an output node of the pull-up main driver 530 may be floated. To this end, all transistors included in the pull-up trim output circuit PUTRO may necessarily be turned off.

The pull-up trim output circuit PUTRO may be composed of second type, e.g., NMOS, transistors. For example, the pull-up trim output circuit PUTRO may include first to kth trim transistors N1 to Nk. The first to kth trim transistors N1 to Nk may be coupled in parallel between the power supply VCC terminal and the input/output pad DQ. In other words, the main pull-up transistor MPUTR and the first to kth trim transistors N1 to Nk may be coupled in parallel between the power supply VCC terminal and the input/output pad DQ. All first to kth trim transistors N1 to Nk may be NMOS transistors. An NMOS transistor may be turned on in response to a lower turn-on voltage than a PMOS transistor. In other words, the NMOS transistor may allow a larger amount of current to flow than the PMOS transistor in response to the same turn-on voltage. Therefore, when all first to kth trim transistors N1 to Nk are NMOS transistors, the entire size of the pull-up trim output circuit PUTRO may be reduced. In addition, since the first to kth trim transistors N1 to Nk may operate at a low voltage, capacitance occurring in the pull-up trim output circuit PUTRO may be reduced.

The first to kth trim transistors N1 to Nk may be turned on or off in response to the respective bits included in the pull-up trim codes PUTR<k:1>. For example, when the first pull-up trim code PUTR<1> is '1', the first trim transistor N1 may be turned on, and when the first pull-up trim code PUTR<1> is '0', the first trim transistor N1 may be turned off. When the number of NMOS transistors turned on increases, an emphasis function may be performed. On the other hand, when the number of NMOS transistors turned on decreases, a de-emphasis function may be performed.

The first to kth trim transistors N1 to Nk may have the same or different sizes. For example, when the first to kth trim transistors N1 to Nk have the same size, the number of NMOS transistors turned on increases as the number of '1' bits included in the pull-up trim codes PUTR<k:1> increases and thus the amount of current flowing through the pull-up main driver 530 may increase. On the other hand, when the number of '0' bits included in the pull-up trim codes PUTR<k:1> increases, the number of NMOS transistors turned on may be reduced. As a result, the amount of current flowing through the pull-up main driver 530 may be reduced. According to another embodiment, when the first to kth trim transistors N1 to Nk have different sizes, the amount of current flowing through the pull-up main driver 530 may increase when a large-size transistor is turned on and the amount of current flowing through the pull-up main driver 530 may be reduced when a small-size transistor is turned on. Thus, the pull-up trim circuit 512 of FIG. 5 may be designed such that the pull-up trim codes PUTR<k:1> may be output in consideration of the sizes of the first to kth trim transistors N1 to Nk.

As described above, when the main pull-up transistor MPUTR is a PMOS transistor and the pull-up trim output circuit PUTRO is composed of NMOS transistors, an output signal having a full swing width may be output by the PMOS transistor, the size of the pull-up main driver 530 may be reduced by the NMOS transistors, and capacitance also may be reduced. For example, when the pull-up main driver 530 includes all NMOS transistors, an output signal having a narrower swing width than a PMOS transistor may be output. Therefore, according to this embodiment, the main pull-up transistor MPUTR operating in response to the pull-up main data PU_MD may be a PMOS transistor and the first to kth trim transistors N1 to Nk for correcting an output signal may be NMOS transistors.

Figure 10:
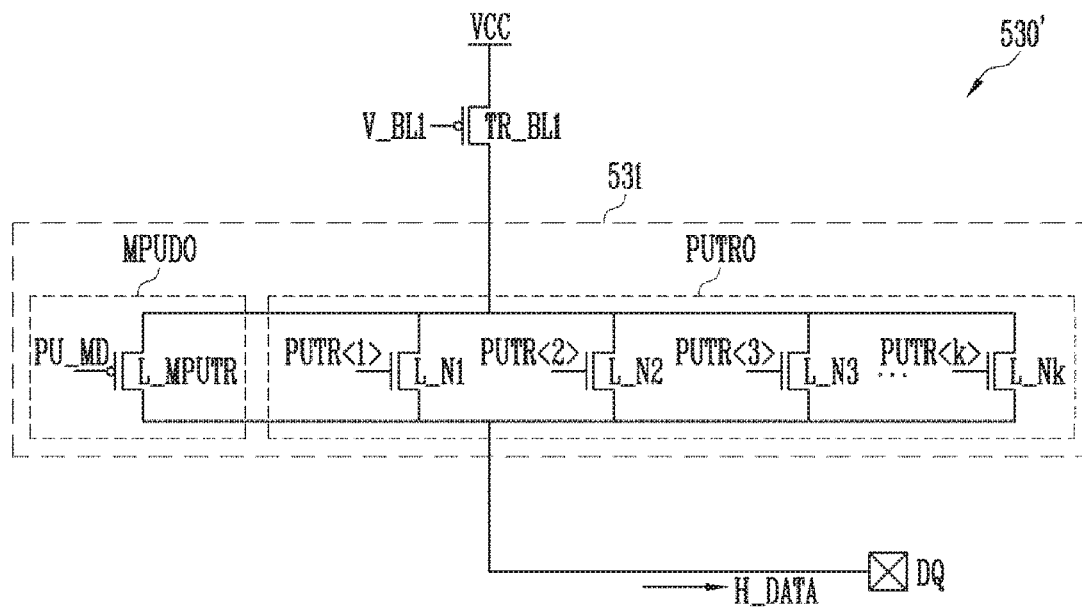
FIG. 10 is a diagram illustrating a pull-up main driver such as that shown in FIG. 4 according to another embodiment of the present disclosure.

FIG. 10 is a diagram illustrating another embodiment of the pull-up main driver 530 shown in FIG. 4.

Referring to FIG. 10, in order to further reduce the size and capacitance of the pull-up main driver 530, the main pull-up transistor MPUTR and the first to kth trim transistors N1 to Nk as shown in FIG. 9 may be low-voltage transistors.

For example, the main pull-up transistor MPUTR included in a pull-up main driver 530' may be a low-voltage main pull-up transistor L_MPUTR, and the first to kth trim transistors N1 to Nk may be low-voltage first to kth trim transistors L_N1 to L_Nk. A low-voltage transistor may have a smaller size than a normal transistor and operate in response to a lower voltage. However, current leakage may occur when the low-voltage transistor is turned off. Therefore, a first blocking transistor TR_BL1 may be further included to block the current leakage of the low-voltage transistor.

The first blocking transistor TR_BL1 may be coupled between the power supply VCC terminal and the pull-up transistors 531 and be a normal transistor rather than a low-voltage transistor. For example, the first blocking transistor TR_BL1 may be a normal PMOS transistor. The first blocking transistor TR_BL1 may be turned on or off in response to the first blocking signal V_BL1 output from the control logic 300 of FIG. 2. The control logic 300 may deactivate or disable the first blocking signal V_BL1 to a high level when an output operation is not performed and may activate or enable the first blocking signal V_BL1 to a low level when the output operation is performed. Therefore, the first blocking transistor TR_BL1 may keep turned off when the output operation is not performed and may keep turned on when the output operation is performed.

Figure 11:
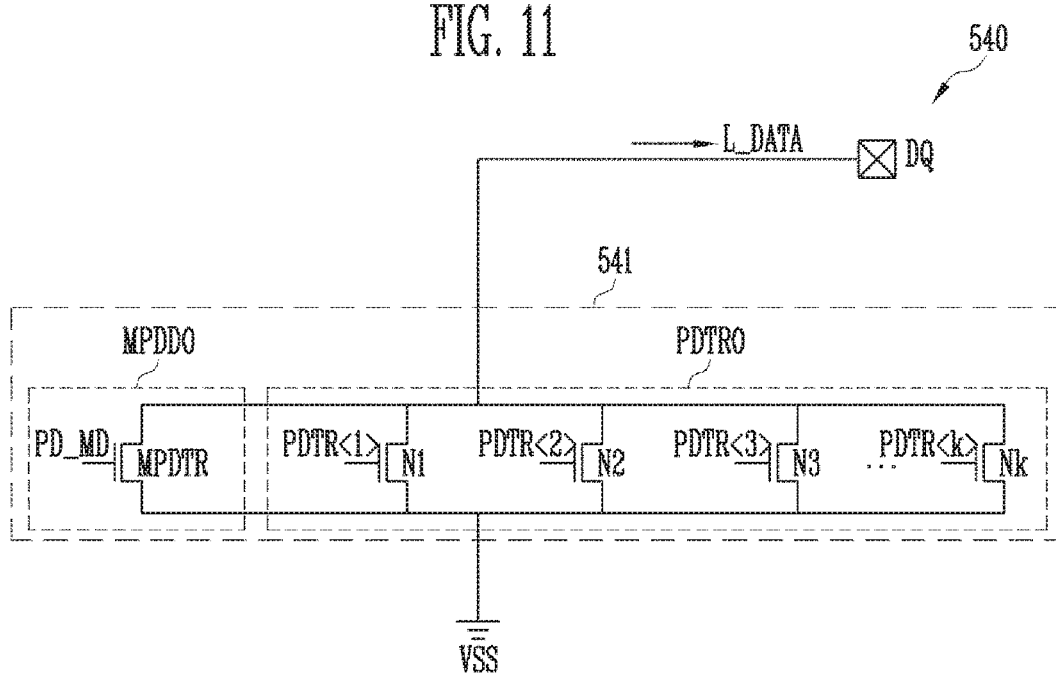
FIG. 11 is a diagram illustrating a pull-down main driver such as that shown in FIG. 4.

FIG. 11 is a diagram illustrating the pull-down main driver 540 shown in FIG. 4.

Referring to FIG. 11, the pull-down main driver 540 may include pull-down transistors 541. The pull-down transistors 541 may be coupled in series between the input/output pad DQ and a ground VSS terminal. For example, the pull-down transistors 541 may be coupled between the ground VSS terminal and the input/output pad DQ. The pull-down transistors 541 may be directly coupled to the ground VSS terminal and perform an emphasis function or a de-emphasis function.

The pull-down transistors 541 may include a main pull-down data output circuit MPDDO and a pull-down trim output circuit PDTRO.

The main pull-down data output circuit MPDDO may include a main pull-down transistor MPDTR which is turned on or off in response to the pull-down main data PD_MD. The main pull-down transistor MPDTR may be a second type transistor, e.g., an NMOS transistor. Therefore, when high level pull-down main data PD_MD is received, the main pull-down transistor MPDTR may be turned on to couple the ground VSS terminal and the input/output pad DQ, so that low level data L_DATA may be output. When low level pull-down main data PD_MD is received, the main pull-down transistor MPDTR may be turned off, so that the output node of the pull-down main driver 540 may be floated. To this end, all transistors included in the pull-down trim output circuit PDTRO may necessarily be turned off.

The pull-down trim output circuit PDTRO may be composed of second type, e.g., NMOS, transistors. For example, the pull-down trim output circuit PDTRO may include the first to kth trim transistors N1 to Nk. Since the first to kth trim transistors N1 to Nk included in the pull-down trim output circuit PDTRO are physically different from the first to kth trim transistors N1 to Nk included in the pull-up trim output circuit PUTRO, the first to kth trim transistors N1 to Nk described with reference to FIG. 11 may be included in the pull-down trim output circuit PDTRO.

The first to kth trim transistors N1 to Nk may be coupled in parallel between the input/output pad DQ and the ground VSS terminal. In other words, the main pull-down transistor MPDTR and the first to kth trim transistors N1 to Nk may be coupled in parallel between the input/output pad DQ and the ground VSS terminal. All first to kth trim transistors may be NMOS transistors.

The first to kth trim transistors N1 to Nk may be turned on or off in response to the respective bits included in the pull-down trim codes PDTR<k:1>. For example, when the first pull-down trim code PDTR<1> is '1', the first trim transistor N1 may be turned on, and when the first pull-down trim code PDTR<1> is '0', the first trim transistor N1 may be turned off. When the number of NMOS transistors turned on increases, an emphasis function may be performed. On the other hand, when the number of NMOS transistors turned on decreases, a de-emphasis function may be performed.

The first to kth trim transistors N1 to Nk may have the same or different sizes. For example, when the first to kth trim transistors N1 to Nk have the same size, the number of NMOS transistors turned on increases as the number of '1' bits included in the pull-down trim codes PDTR<k:1> increases and thus the amount of current flowing through the pull-down main driver 540 may increase. On the other hand, when the number of '0' bits included in the pull-down trim codes PDTR<k:1> increases, the number of NMOS transistors turned on may be reduced. As a result, the amount of current flowing through the pull-down main driver 540 may be reduced. According to another embodiment, when the first to kth trim transistors N1 to Nk have different sizes, the amount of current flowing through the pull-down main driver 540 may increase when a large-size transistor is turned on and the amount of current flowing through the pull-down main driver 540 may be reduced when a small-size transistor is turned on. Thus, the pull-down trim circuit 522 of FIG. 7 may be designed such that the pull-down trim codes PDTR<k:1> may be output in consideration of the sizes of the first to kth trim transistors N1 to Nk.

Figure 12:
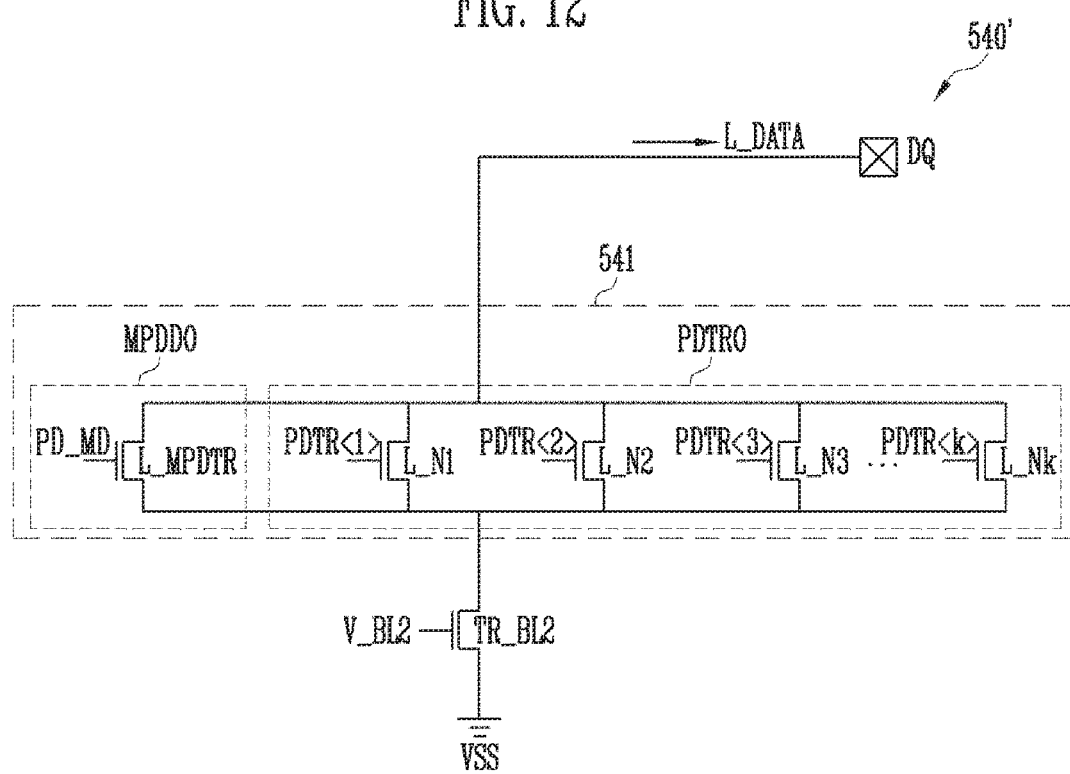
FIG. 12 is a diagram illustrating a pull-down main driver such as that shown in FIG. 4 according to another embodiment of the present disclosure.

FIG. 12 is a diagram illustrating another embodiment of the pull-down main driver 540 shown in FIG. 4.

Referring to FIG. 12, in order to further reduce the size and capacitance of the pull-down main driver 540, the main pull-down transistor MPDTR and the first to kth trim transistors N1 to Nk as shown in FIG. 11 may be low-voltage transistors.

For example, the main pull-down transistor MPDTR included in a pull-down main driver 540' may be a low-voltage main pull-down transistor L_MPDTR, and the first to kth trim transistors N1 to Nk may be low-voltage first to kth trim transistors L_N1 to L_Nk. A low-voltage transistor may have a smaller size than a normal transistor and operate in response to a low voltage. However, current leakage may occur when the low-voltage transistor is turned off. Therefore, a second blocking transistor TR_BL2 may be further included to block the current leakage of the low-voltage transistor.

The second blocking transistor TR_BL2 may be coupled between the ground VSS terminal and the pull-down transistors 541 and be normal transistors rather than low-voltage transistors. For example, the second blocking transistor TR_BL2 may be a normal NMOS transistor. The second blocking transistor TR_BL2 may be turned on or off in response to the second blocking signal V_BL2 output from the control logic 300 of FIG. 2. The control logic 300 may deactivate or disable the second blocking signal V_BL2 to a low level when an output operation is not performed and may activate or enable the second blocking signal V_BL2 to a high level when the output operation is performed. Therefore, the second blocking transistor TR_BL2 may keep turned off when the output operation is not performed, and may keep turned on when the output operation is performed.

Figure 13:
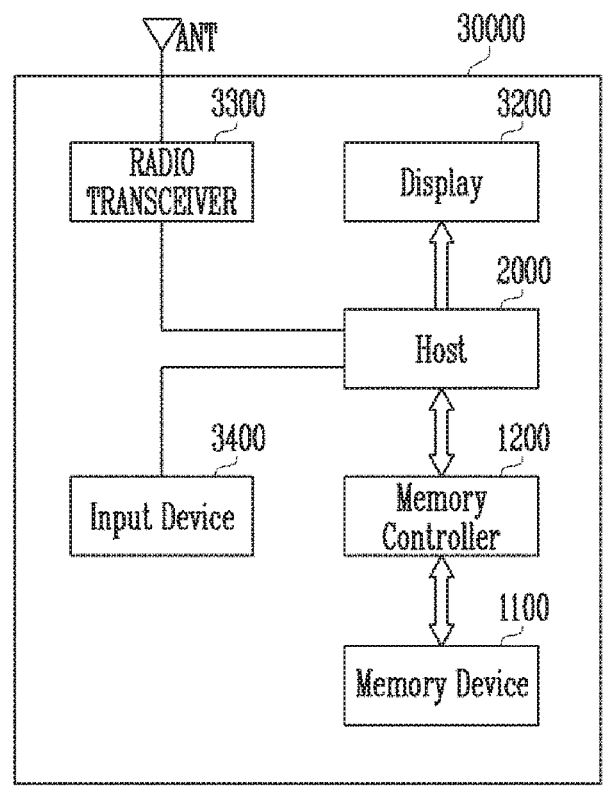
FIG. 13 is a diagram illustrating another embodiment of a memory system including a memory device shown in FIG. 2.

FIG. 13 is a diagram illustrating another embodiment of a memory system 30000 including the memory device shown 1100 in FIG. 2.

Referring to FIG. 13, the memory system 30000 may be embodied in a cellular phone, a smart phone, a tablet PC, a personal digital assistant (PDA), or a wireless communication device.

The memory system 30000 may include the memory device 1100 and the memory controller 1200 controlling the operations of the memory device 1100. The memory controller 1200 may control a data access operation of the memory device 1100, for example, a program operation, an erase operation or a read operation of the memory device 1100 in response to control of a host 2000.

The memory controller 1200 may control data programmed into the memory device 1100 to be output through a display 3200.

A radio transceiver 3300 may exchange a radio signal through an antenna ANT. For example, the radio transceiver 3300 may convert the radio signal received through the antenna ANT into a signal which can be processed by the host 2000. Therefore, the host 2000 may process the signal output from the radio transceiver 3300 and transfer the processed signal to the memory controller 1200 or the display 3200. The memory controller 1200 may transfer the signal processed by the host 2000 into the memory device 1100. In addition, the radio transceiver 3300 may convert a signal output from host 2000 into a radio signal and output the radio signal to an external device through the antenna ANT. A control signal for controlling the operations of the host 2000 or data to be processed by the host 2000 may be input by an input device 3400, and the input device 3400 may include a pointing device, such as a touch pad and a computer mouse, a keypad, or a keyboard. The host 2000 may control the operations of the display 3200 so that data output from the memory controller 1200, data output from the radio transceiver 3300, or data output from an input device 3400 may be output through the display 3200.

Figure 14:
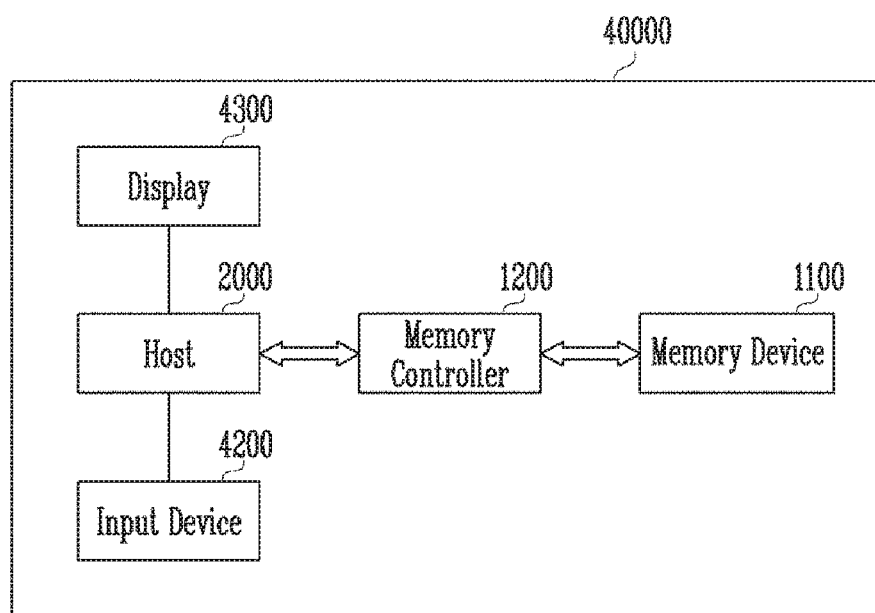
FIG. 14 is a diagram illustrating another embodiment of a memory system including a memory device shown in FIG. 2.

FIG. 14 is a diagram illustrating another embodiment of the memory system 40000 including the memory device 1100 shown in FIG. 2.

Referring to FIG. 14, a memory system 40000 may be provided as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

The host 2000 may output data stored in the memory device 1100 through a display 4300 according to data input through an input device 4200. Examples of the input device 4200 include a pointing device such as a touch pad or a computer mouse, a keypad, or a keyboard.

The host 2000 may control the general operations of the memory system 40000 and control the operations of the memory controller 1200.

Figure 15:
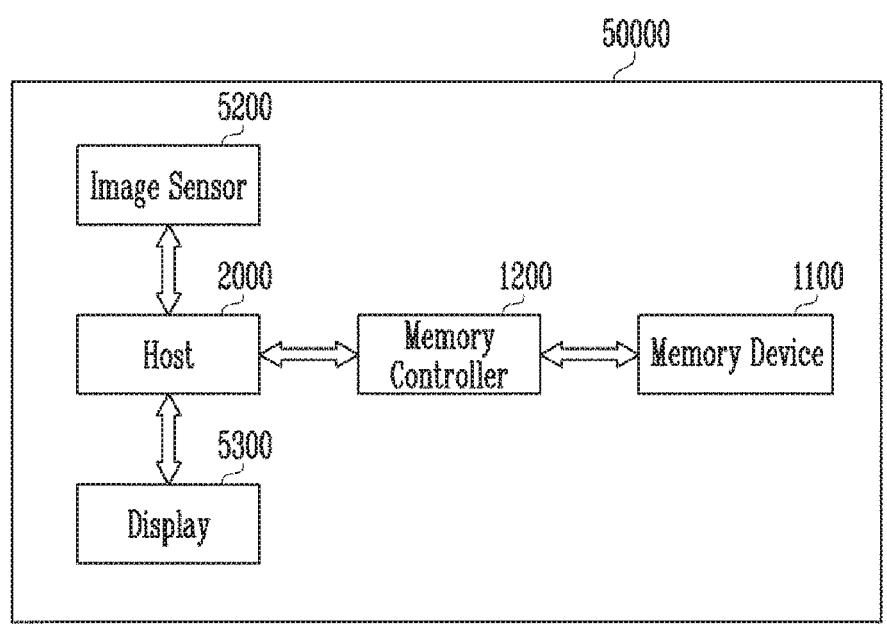
FIG. 15 is a diagram illustrating another embodiment of a memory system including a memory device shown in FIG. 2.

FIG. 15 is a diagram illustrating another embodiment of the memory system 50000 including the memory device 1100 shown in FIG. 2.

Referring to FIG. 15, a memory system 50000 may be embodied in an image processor, for example, a digital camera, a cellular phone with a digital camera attached thereto, a smartphone with a digital camera attached thereto, or a table PC with a digital camera attached thereto.

The memory system 50000 may include the memory device 1100 and the memory controller 1200 controlling a data processing operation of the memory device 1100, for example, a program operation, an erase operation or a read operation.

An image sensor 5200 of the memory system 50000 may convert an optical image into digital signals, and the converted digital signals may be transferred to the host 2000. In response to control of the host 2000, the converted digital signals may be output through the display 5300 or stored in the memory device 1100 through the memory controller 1200. In addition, the data stored in the memory device 1100 may be output through the display 5300 according to control of the host 2000.

Figure 16:
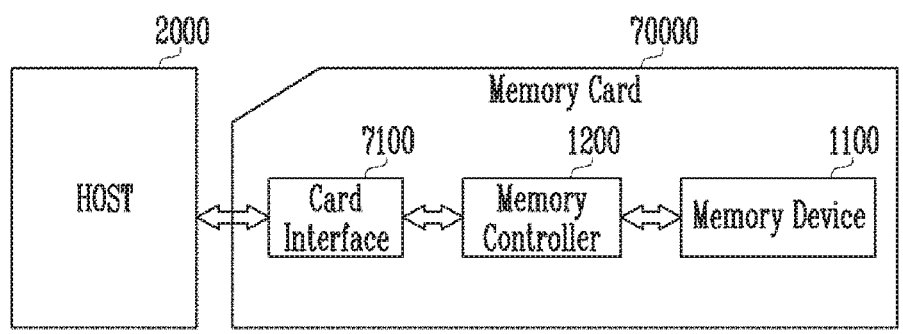
FIG. 16 is a diagram illustrating another embodiment of a memory system including a memory device shown in FIG. 2.

FIG. 16 is a diagram illustrating another embodiment of the memory system 30000 including the memory device shown 1100 in FIG. 2.

Referring to FIG. 16, the memory system 30000 may include the host 2000 and a memory card 70000.

The memory card 70000 may be embodied in a smart card. The memory card 70000 may include the memory device 1100, the memory controller 1200 and a card interface 7100.

The memory controller 1200 may control data exchange between the memory device 1100 and the card interface 7100. The card interface 7100 may be, but is not limited to, a secure digital (SD) card interface or a multi-media card (MMC) interface. In addition, the card interface 7100 may interface data exchange between the host 2000 and the memory controller 1200 according to a protocol of the host 2000. According to an embodiment, the card interface 7100 may support a Universal Serial Bus (USB) protocol and/or an InterChip (IC)-USB protocol. The card interface 7100 may refer to hardware that supports a protocol used by the host 2000, software mounted on the hardware, or a signal transmission method.

According to embodiments of the present disclosure, capacitance and size of a data output buffer may be reduced.

It will be apparent to those skilled in the art that various modifications can be made to the above-described embodiments of the present invention without departing from the spirit or scope of the invention. Thus, it is intended that the present invention cover all such modifications provided they come within the scope of the appended claims and their equivalents.

What is claimed is:
1. A data output buffer, comprising:
a pull-up main driver, coupled between a power supply terminal and an output terminal, configured to output data of a high level; and
a pull-down main driver, coupled between the output terminal and a ground terminal, configured to output data of a low level,
wherein the pull-up main driver comprises:
a main pull-up transistor of a first type, operating in response to pull-up main data; and
a plurality of first trim transistors, each of a second type, operating in response to pull-up trim codes, respectively.

2. The data output buffer of claim 1,
wherein the first type is a PMOS transistor, and
wherein the second type is an NMOS transistor.

3. The data output buffer of claim 1, wherein the main pull-up transistor and the first trim transistors are coupled in parallel between the power supply terminal and the output terminal.

4. The data output buffer of claim 3,
wherein the main pull-up transistor outputs the data of the high level in response to the pull-up main data, and
wherein the first trim transistors correct the data of the high level in response to the pull-up trim codes.

5. The data output buffer of claim 4, wherein the first trim transistors are all turned off when the main pull-up transistor is turned off.

6. The data output buffer of claim 3,
wherein the main pull-up transistor includes a low-voltage PMOS transistor, and wherein the first trim transistors include low-voltage NMOS transistors.

7. The data output buffer of claim 6, further comprising a blocking transistor, coupled between the pull-up main driver and the power supply terminal, configured to block a current path in response to a blocking signal.

8. The data output buffer of claim 7, wherein the blocking transistor includes a non-low-voltage PMOS transistor.

9. The data output buffer of claim 1, wherein the pull-down main driver includes:
a main pull-down transistor of the second type; and
a plurality of second trim transistors, each of the second type.

10. The data output buffer of claim 9, wherein the main pull-down transistor and the second trim transistors are coupled in parallel between the power supply terminal and the output terminal.

11. The data output buffer of claim 10,
wherein the main pull-down transistor outputs the data of the low level in response to pull-down main data, and
wherein the second trim transistors correct the data of the low level in response to pull-down trim codes, respectively.

12. The data output buffer of claim 11, wherein the second trim transistors are all turned off when the main pull-down transistor is turned off.

13. The data output buffer of claim 9, wherein the main pull-down transistor and the second trim transistors include low-voltage NMOS transistors.

14. The data output buffer of claim 13, further comprising a blocking transistor, coupled between the pull-down main driver and the ground terminal, configured to block a current path in response to a blocking signal.

15. The data output buffer of claim 14, wherein the blocking transistor includes a non-low-voltage NMOS transistor.

16. A memory device, comprising:
a memory cell array configured to store data;
a peripheral circuit configured to perform a program operation, a read operation, an erase operation, or an output operation on the memory cell array; and
control logic configured to control the peripheral circuit in response to a command received from a memory controller,
wherein the peripheral circuit comprises:
a pull-up main driver including a main pull-up transistor of a first type and a plurality of first trim transistors, each of a second type and configured to output data of a high level to the memory controller according to control of the control logic during the output operation, wherein the main pull-up transistor operates in response to pull-up main data, and the first trim transistors operate in response to pull-up trim codes, respectively; and
a pull-down main driver including transistors of the second type and configured to output data of a low level to the memory controller according to control of the control logic during the output operation.

17. The memory device of claim 16, wherein the main pull-up transistor and the first trim transistors are coupled in parallel between a power supply terminal and an output terminal.

18. The memory device of claim 17,
wherein the main pull-up transistor outputs the data of the high level in response to the pull-up main data, and wherein the first trim transistors correct the data of the high level in response to the pull-up trim codes, respectively.

19. The memory device of claim 16, wherein the pull-down main driver comprises a main pull-down transistor of the second type and a plurality of second trim transistors, each of the second type.

20. The memory device of claim 19, wherein the main pull-down transistor and the second trim transistors are coupled in parallel between a ground terminal and an output terminal.

21. The memory device of claim 20,
wherein the main pull-down transistor outputs the data of the low level in response to pull-down main data, and
wherein the second trim transistors correct the data of the low level in response to pull-down trim codes, respectively.

22. The memory device of claim 16, further comprising a first blocking transistor and a second blocking transistor configured to selectively activate the pull-up main driver and the pull-down main driver respectively.

23. The memory device of claim 22, wherein the first blocking transistor is coupled between a power supply terminal and the pull-up main driver, and forms or blocks a current path according to control of the control logic.

24. The memory device of claim 22, wherein the second blocking transistor is coupled between a ground terminal and the pull-down main driver, and forms or blocks a current path according to control of the control logic.

25. The memory device of claim 22, wherein the control logic comprises:
a command detector configured to detect whether a command received from the memory controller is an internal operation command or an output command, and to output information about a result of the detection along with the command; and
an operation controller configured to output first and second blocking signals for controlling the first and second blocking transistors in response to the command and the information about the detection result received from the command detector.

26. The memory device of claim 25, wherein the command detector is configured to:
disable the first and second blocking signals so that both the pull-up main driver and the pull-down main driver are deactivated when the command received from the memory controller is the output command, and
enable the first and second blocking signals so that both the pull-up main driver and the pull-down main driver are activated when the command received from the memory controller is the internal operation command.

27. The memory device of claim 26, wherein output nodes of the pull-up main driver and the pull-down main driver are floated when the first and second blocking signals are enabled.

28. A data output buffer comprising:
a pull-up driver configured to pull up data; and
a pull-down driver configured to pull down the data,
wherein the pull-up driver includes:
a PMOS transistor configured to pull up the data; and
one or more NMOS transistors configured to emphasize or de-emphasize the pull-up of the data in response to pull-up trim codes respectively corresponding thereto, and wherein the pull-down driver includes:
a main transistor configured to pull down the data; and
one or more trim transistors configured to emphasize or de-emphasize the pull-down of the data in response to pull-down trim codes respectively corresponding thereto.

* * * * *